(12) United States Patent
She et al.

(10) Patent No.: US 10,975,467 B2
(45) Date of Patent: Apr. 13, 2021

(54) GAS DISTRIBUTION FOR CHEMICAL VAPOR DEPOSITION/INFILTRATION

(71) Applicant: GOODRICH CORPORATION, Charlotte, NC (US)

(72) Inventors: Ying She, East Hartford, CT (US); Naveen G. Menon, Anaheim, CA (US); Zissis A. Dardas, Worcester, MA (US); Thomas P. Filburn, Granby, CT (US); Xiaodan Cai, Glastonbury, CT (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 16/598,843

(22) Filed: Oct. 10, 2019

(65) Prior Publication Data

US 2020/0040447 A1 Feb. 6, 2020

Related U.S. Application Data

(63) Continuation of application No. 15/709,338, filed on Sep. 19, 2017, now Pat. No. 10,480,065.

(51) Int. Cl.
*C23C 16/04* (2006.01)
*C23C 16/32* (2006.01)
(Continued)

(52) U.S. Cl.
CPC ...... *C23C 16/045* (2013.01); *C04B 35/62863* (2013.01); *C04B 35/62884* (2013.01); *C04B 35/806* (2013.01); *C23C 16/325* (2013.01); *C23C 16/4405* (2013.01); *C23C 16/4412* (2013.01); *C23C 16/45502* (2013.01); *C23C 16/45565* (2013.01); *C23C 16/45574* (2013.01);
(Continued)

(58) Field of Classification Search
CPC .................................................. C23C 16/4412
See application file for complete search history.

(56) References Cited

U.S. PATENT DOCUMENTS 4,340,636 A 7/1982 DeBolt
4,651,141 A * 3/1987 Kimura ............... G08B 17/117
340/634

(Continued)

FOREIGN PATENT DOCUMENTS

JP H03257167 11/1991

OTHER PUBLICATIONS

European Patent Office, European Office Action dated Aug. 21, 2019 in Application No. 18183737.8.
(Continued)

*Primary Examiner* — Keath T Chen
(74) *Attorney, Agent, or Firm* — Snell & Wilmer L.L.P.

(57) ABSTRACT

A gas distribution plate for a chemical vapor deposition/infiltration system includes a body having a first side and a second side opposite the first side. The body may be hollow and may define an internal cavity. The gas distribution plate may also include a plurality of pass-through tubes extending through the internal cavity, a cavity inlet, and a plurality of cavity outlets. A reaction gas may be configured to flow through the plurality of pass-through tubes and a gaseous mitigation agent may be configured to flow into the internal cavity via the cavity inlet and out of the internal cavity via the plurality of cavity outlets to mix with reaction gas.

4 Claims, 10 Drawing Sheets

(51) Int. Cl.
  *C23C 16/44* (2006.01)
  *C04B 35/80* (2006.01)
  *C04B 35/628* (2006.01)
  *C23C 16/455* (2006.01)

(52) U.S. Cl.
  CPC .......... *C04B 2235/3826* (2013.01); *C04B 2235/444* (2013.01); *C04B 2235/483* (2013.01); *C04B 2235/5244* (2013.01); *C04B 2235/5248* (2013.01); *C04B 2235/614* (2013.01)

(56) References Cited

U.S. PATENT DOCUMENTS

| | | | |
|---|---|---|---|
| 5,352,484 A * | 10/1994 | Bernard | C04B 35/83 427/228 |
| 5,527,747 A | 6/1996 | Lackey, Jr. | |
| 5,609,721 A | 3/1997 | Tsukune et al. | |
| 5,738,908 A | 4/1998 | Rey et al. | |
| 6,197,374 B1 | 3/2001 | Huttinger et al. | |
| 6,630,029 B2 | 10/2003 | Brun | |
| 2002/0006478 A1 | 1/2002 | Yuda et al. | |
| 2004/0050328 A1 | 3/2004 | Kumagai et al. | |
| 2005/0183666 A1 | 8/2005 | Tsuji et al. | |
| 2006/0060138 A1 | 3/2006 | Keller | |
| 2007/0272154 A1 | 11/2007 | Amikura | |
| 2009/0169744 A1 * | 7/2009 | Byun | C23C 16/45514 427/255.28 |
| 2010/0166630 A1 * | 7/2010 | Gu | B01F 5/0693 423/215.5 |
| 2011/0197759 A1 * | 8/2011 | Smith | H01J 37/32844 95/4 |
| 2011/0206585 A1 | 8/2011 | Hara | |
| 2015/0353371 A1 | 12/2015 | Caton | |
| 2016/0225619 A1 | 8/2016 | Ruda Y Witt et al. | |
| 2016/0229758 A1 | 8/2016 | Kmetz | |
| 2016/0297716 A1 | 10/2016 | Nakamura et al. | |
| 2016/0305015 A1 | 10/2016 | Nakamura et al. | |

OTHER PUBLICATIONS

USPTO, Final Office Action dated Dec. 2, 2019 in U.S. Appl. No. 15/650,400.
USPTO, Advisory Action dated Feb. 4, 2020 in U.S. Appl. No. 15/650,400.
K. Brennfleck, et al.; In-situ-spectroscopic monitoring for SIC-CVD process control; Journal de Physique IV, 1999, pp. Pr8-1041-Pr8-1048.
J. Schlichting; Review 13 Chemical Vapor Deposition of Silicon Carbide; Powder Metallurgy International vol. 12, No. 3, 1980, pp. 141-147.
J. Schlichting; Review 13 Chemical Vapor Deposition of Silicon Carbide*; Powder Metallurgy International vol. 12, No. 4, 1980, pp. 196-200.
Weigang G. Zhang and Klaus J. Huttinger; CVD of SiC from Methyltrichlorosinae. Part II: Compositionof the Gas Phase and the Deposit**; Chem. Vap. Deposition 2001, 7, No. 4, pp. 173-181.
Application as filed in U.S. Appl. No. 15/650,400, filed Jul. 14, 2017.
European Patent Office, European Search Report dated Dec. 13, 2018 in Application No. 18183737.8.
European Patent Office, European Partial Search Report dated Feb. 19, 2019 in Application No. 18194913.2.
USPTO, Restriction/Election Requirement dated May 10, 2019 in U.S. Appl. No. 15/650,400.
European Patent Office, European Search Report dated May 23, 2019 in Application No. 18194913.2.
USPTO, Non-Final Office Action dated Dec. 13, 2018 in U.S. Appl. No. 15/709,338.
USPTO, Final Office Action dated Mar. 14, 2019 in U.S. Appl. No. 15/709,338.
USPTO, Restriction/Election Requirement dated Jul. 13, 2019 in U.S. Appl. No. 15/709,338.
USPTO, Advisory Action dated May 23, 2019 in U.S. Appl. No. 15/709,338.
USPTO, Notice of Allowance dated Aug. 14, 2019 in U.S. Appl. No. 15/709,338.
USPTO, Pre-Interview First Office Action dated Sep. 5, 2019 in U.S. Appl. No. 15/650,400.

* cited by examiner

GAS DISTRIBUTION FOR CHEMICAL VAPOR DEPOSITION/INFILTRATION

CROSS-REFERENCE TO RELATED APPLICATIONS

This application is a continuation of, claims priority to and the benefit of, U.S. Ser. No. 15/709,338 filed Sep. 19, 2017 and entitled "GAS DISTRIBUTION FOR CHEMICAL VAPOR DEPOSITION/INFILTRATION," which is incorporated herein by reference in its entirety for all purposes.

FIELD

The present disclosure relates to composite manufacturing, and more specifically, to gas distribution devices for chemical vapor deposition/infiltration systems and methods.

BACKGROUND

Carbon/carbon (C/C) composites are used in the aerospace industry for aircraft brake heat sink materials, among other applications. Silicon carbide (SiC) based ceramic matrix composites (CMCs) have found use as brake materials and other components in automotive and locomotive industries. These composites are typically produced using, for example, chemical vapor infiltration (CVI) or chemical vapor deposition (CVD). Such processes generally include placing porous preforms into a reactor and introducing a gaseous precursor to form silicon carbide depositions within the pores of the preform.

However, conventional infiltration and/or or deposition processes result in byproduct deposits accumulating within system components of the manufacturing system, such as the exhaust piping. The byproduct deposits may be reactive and even pyrophoric, and thus precautions are warranted to promote a safe manufacturing environment. For example, conventional manufacturing systems are often shut-down for periods of time while users manually clean the components and piping of the manufacturing system to remove the byproduct deposits. This cleaning procedure increases the downtime of the manufacturing system and thus decreases the capacity and throughput of conventional ceramic matrix composite manufacturing systems.

SUMMARY

In various embodiments, the present disclosure provides a gas distribution plate for a chemical vapor deposition/infiltration system. The gas distribution plate includes a body having a first side and a second side opposite the first side, according to various embodiments. The body may be hollow and may define an internal cavity. The gas distribution plate may further include a plurality of pass-through tubes extending through the internal cavity, with each pass-through tube of the plurality of pass-through tubes extending from a first opening defined in the first side of the body to a second opening defined in the second side of the body. A reaction gas may be configured to flow through the plurality of pass-through tubes. The gas distribution plate may further include a cavity inlet defined in the body and a plurality of cavity outlets defined in the second side of the body. A gaseous mitigation agent may be configured to flow into the internal cavity of the body via the cavity inlet and the gaseous mitigation agent is configured to flow out the internal cavity via the plurality of cavity outlets.

In various embodiments, the reaction gas in the plurality of pass-through tubes is isolated from the gaseous mitigation agent in the internal cavity. In various embodiments, the plurality of cavity outlets are distributed among the second opening of the plurality of pass-through tubes. In various embodiments, the gas distribution plate further includes a plurality of static mixing features extending from the second side of the gas distribution plate, wherein the plurality of static mixing features facilitates mixing of the gaseous mitigation agent with the reaction gas. Each static mixing feature of the plurality of static mixing features may be "T" shaped.

In various embodiments, the body includes a conical distribution feature protruding into the internal cavity from the second side of the body opposite the cavity inlet. In various embodiments, a footprint of the conical distribution feature on the second side of the body is solid. In various embodiments, the plurality of cavity outlets and the second opening of the plurality of pass-through tubes are disposed outward of a footprint of the conical distribution feature on the second side of the body.

Also disclosed herein, according to various embodiments, is a system of manufacturing a ceramic matrix composite component. The system may include a chamber having an inlet portion and an outlet portion, wherein the inlet portion is configured to house a porous preform. The system may also include a first inlet for introducing a gaseous precursor into the inlet portion of the chamber, a gas distribution plate disposed between the inlet portion and the outlet portion of the chamber, and a second inlet for introducing a gaseous mitigation agent into an internal cavity defined in the gas distribution plate. The gas distribution plate may facilitate mixing the gaseous mitigation agent with a reaction gas from the inlet portion of the chamber. The system may further include an exhaust conduit coupled in fluidic communication with the outlet portion of the chamber.

In various embodiments, the gas distribution plate includes a plurality of pass-through tubes, wherein the gas distribution plate facilitates mixing the gaseous mitigation agent with the reaction gas from the plurality of pass-through tubes. The gas distribution plate may be a first gas distribution plate, and the system further may further include a second gas distribution plate. The second gas distribution plate may be disposed between the first gas distribution plate and the outlet portion of the chamber. Accordingly, the internal cavity may be a first internal cavity and the second gas distribution plate may include defines a second internal cavity, wherein the gaseous mitigation agent is configured to sequentially flow through both the first internal cavity and the second internal cavity before mixing with the reaction gas. In various embodiments, the second inlet is configured to introduce the gaseous mitigation agent into the first internal cavity via a first cavity inlet. The gaseous mitigation agent may be configured to flow from the first internal cavity to the second internal cavity via a plurality of second cavity inlets extending between the first gas distribution plate and the second gas distribution plate. In various embodiments, the first cavity inlet is a central conduit and the plurality of second cavity inlets are offshoot conduits that are positioned around the central conduit.

In various embodiments, the second gas distribution plate is disposed between the inlet portion of the chamber and the first gas distribution plate. The second gas distribution plate may include a second plurality of pass-through tubes, and the second inlet may include a pass-through conduit that extends through the second gas distribution plate and is configured to introduce the gaseous mitigation agent into the internal cavity via a cavity inlet. In various embodiments, the pass-through conduit is a central conduit and the cavity inlet is one of a plurality of cavity inlets, wherein the plurality of cavity inlets are offshoot conduits that are positioned around the central conduit.

Also disclosed herein, according to various embodiments, is a method of manufacturing a ceramic matrix composite component. The method may include introducing a gaseous precursor into an inlet portion of a chamber that is configured to house a porous preform and introducing a gaseous mitigation agent into an internal cavity of a gas distribution plate disposed between the inlet portion and an outlet portion of the chamber that is downstream of the inlet portion of the chamber. The gaseous mitigation agent may be configured to mix with a reaction gas downstream of the gas distribution plate. The gaseous precursor may include methyltrichlorosilane (MTS) and the gaseous mitigation agent may include hydrogen gas.

The forgoing features and elements may be combined in various combinations without exclusivity, unless expressly indicated herein otherwise. These features and elements as well as the operation of the disclosed embodiments will become more apparent in light of the following description and accompanying drawings.

Figure 1A:
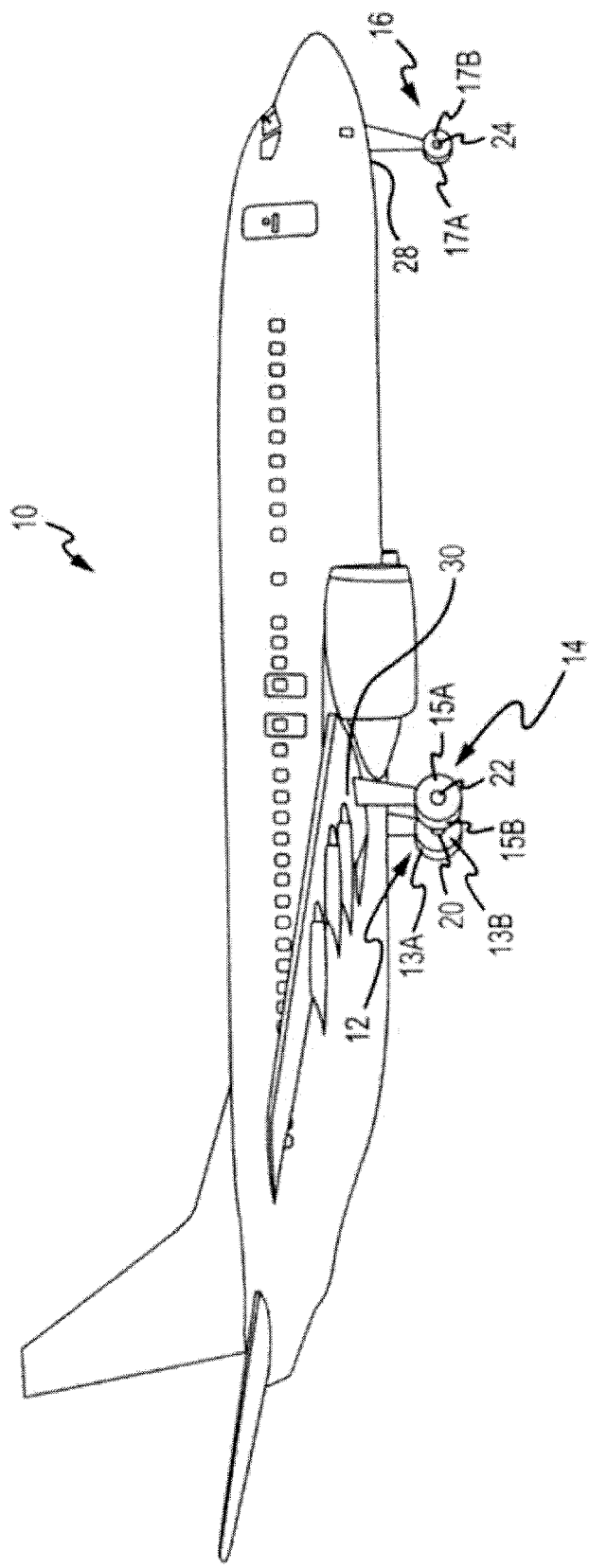
FIG. 1A illustrates an exemplary aircraft having a brake system, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Provided herein, according to various embodiments, is a manufacturing system(s) and associated method(s) for chemical vapor deposition/infiltration processes, such as may be utilized in the fabrication of ceramic matrix composite components. The disclosed systems and methods generally mitigate the formation and accumulation of harmful/hazardous byproduct deposits. While numerous details are included herein pertaining to aircraft components, such as brake components, the manufacturing system(s) and method(s) disclosed herein can be applied to fabricate other ceramic matrix composite components and to other chemical vapor deposition/infiltration processes.

Referring now to FIG. 1A, in accordance with various embodiments, an aircraft 10 may include landing gear such as left main landing gear 12, right main landing gear 14 and nose landing gear 16. Left main landing gear 12, right main landing gear 14, and nose landing gear 16 may generally support aircraft 10 when aircraft 10 is not flying, allowing aircraft 10 to taxi, take off and land without damage. Left main landing gear 12 may include wheel 13A and wheel 13B coupled by an axle 20. Right main landing gear 14 may include wheel 15A and wheel 15B coupled by an axle 22. Nose landing gear 16 may include nose wheel 17A and nose wheel 17B coupled by an axle 24. In various embodiments, aircraft 10 may comprise any number of landing gears and each landing gear may comprise any number of wheels. Left main landing gear 12, right main landing gear 14, and nose landing gear 16 may each be retracted for flight. The landing gear may extend from an underside of the fuselage 28 or from an underside of the wings 30.

Aircraft 10 may also include a brake system which may be applied to a wheel of a landing gear. The brake system of aircraft 10 may comprise a collection of units, assemblies, and subsystems that produce output signals for controlling the braking force and/or torque applied at each wheel (e.g., wheel 13A, wheel 13B, wheel 15A, wheel 15B, etc.). The brake system may communicate with the brakes of each landing gear (e.g., left main landing gear 12, right main landing gear 14, and/or nose landing gear 16), and each brake may be mounted to each wheel to apply and release braking force on one or more wheels. The brakes of an aircraft 10 may include a non-rotatable wheel support, a wheel (e.g., wheel 13A, wheel 13B, wheel 15A, wheel 15B, wheel 17A, and/or wheel 17B) mounted to the wheel support for rotation, and a brake disk stack.

Figure 1B:
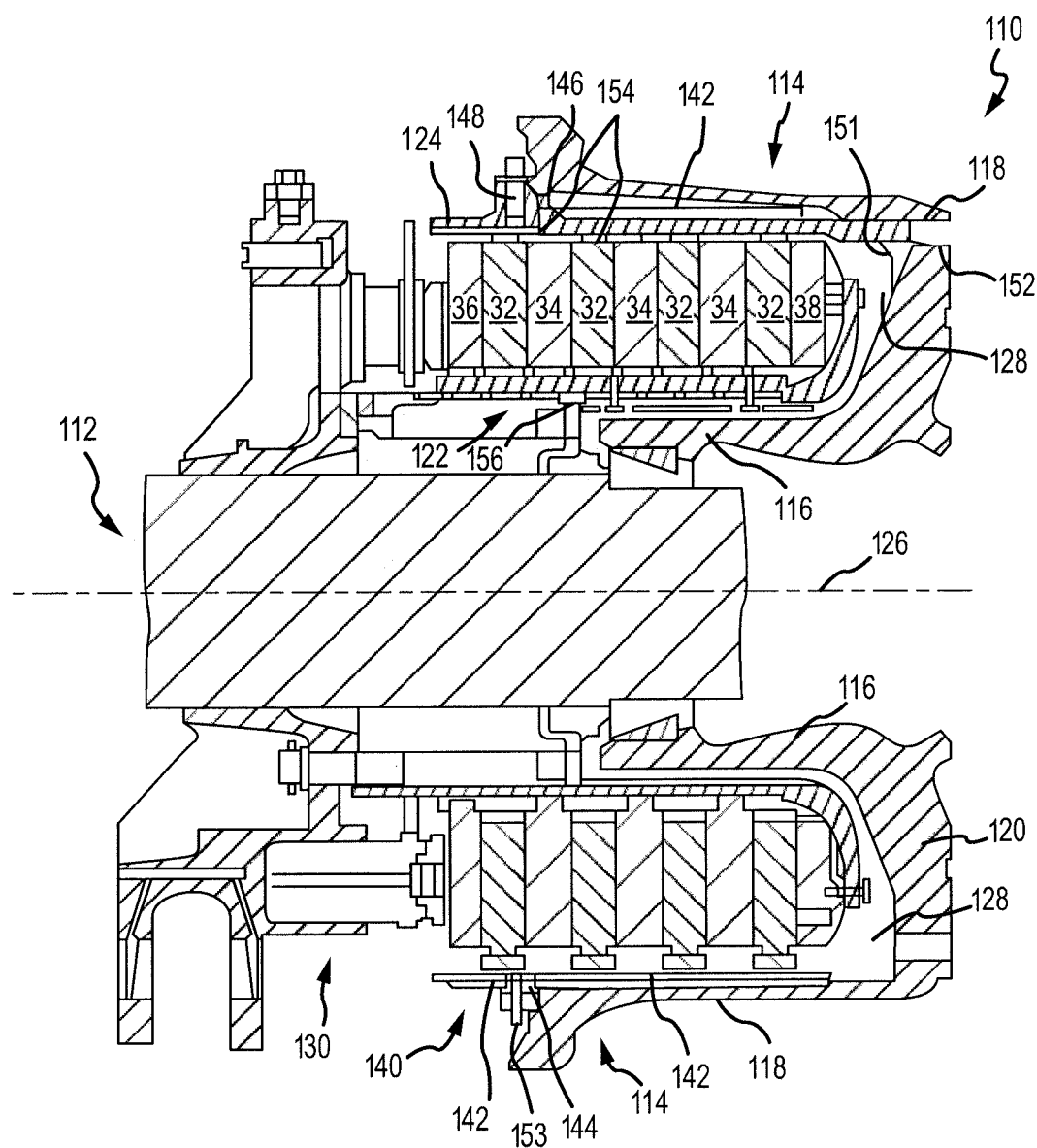
FIG. 1B illustrates a cross-sectional view of a brake assembly, in accordance with various embodiments.

Referring to FIG. 1B, brake assembly 110 may be found on an aircraft, in accordance with various embodiments. Brake assembly 110 may comprise a bogie axle 112, a wheel 114 including a hub 116 and a wheel well 118, a web 120, a torque take-out assembly 122, one or more torque bars 124, a wheel rotational axis 126, a wheel well recess 128, an actuator 130, multiple brake rotors 32, multiple brake stators 34, a pressure plate 36, an end plate 38, a heat shield 140, multiple heat shield sections 142, multiple heat shield carriers 144, an air gap 146, multiple torque bar bolts 148, a torque bar pin 151, a wheel web hole 152, multiple heat shield fasteners 153, multiple rotor lugs 154, and multiple stator slots 156.

Brake disks (e.g., interleaved rotors 32 and stators 34) are disposed in wheel well recess 128 of wheel well 118. Rotors 32 are secured to torque bars 124 for rotation with wheel 114, while stators 34 are engaged with torque take-out assembly 122. At least one actuator 130 is operable to compress interleaved rotors 32 and stators 34 for stopping the aircraft. In this example, actuator 130 is shown as a hydraulically actuated piston. Pressure plate 36 and end plate 38 are disposed at opposite ends of the interleaved rotors 32 and stators 34.

Through compression of interleaved rotors 32 and stators 34 between pressure plate 36 and end plate 38, the resulting frictional contact slows, stops, and/or prevents rotation of wheel 114. Torque take-out assembly 122 is secured to a stationary portion of the landing gear truck such as a bogie beam or other landing gear strut, such that torque take-out assembly 122 and stators 34 are prevented from rotating during braking of the aircraft. Rotors 32 and stators 34 may be fabricated from various materials, such as ceramic matrix composites. The brake disks may withstand and dissipate the heat generated from contact between the brake disks during braking.

Figure 2:
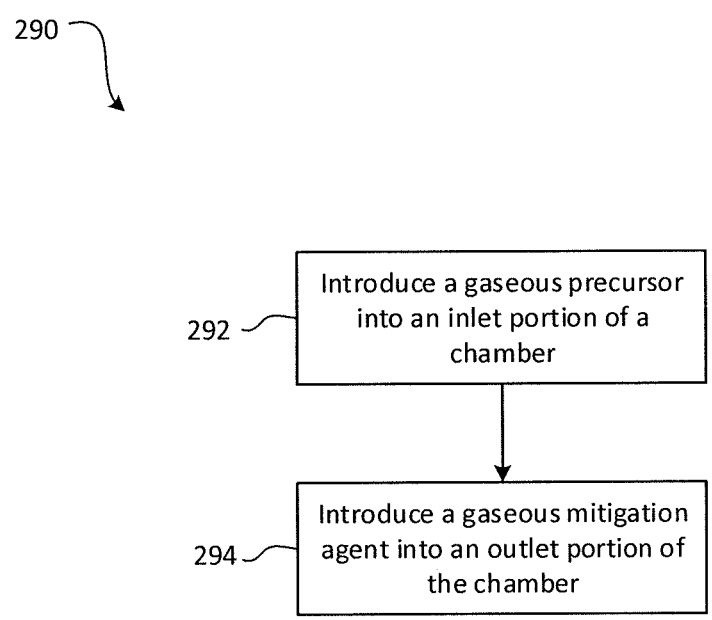
FIG. 2 is a schematic flow chart diagram of a method of manufacturing a ceramic matrix composite, in accordance with various embodiments.

In various embodiments, and with reference to FIG. 2, a method 290 of manufacturing a ceramic matrix composite component, such as a brake disk, is provided. The method 290 may include utilizing the manufacturing apparatus and manufacturing system 305 disclosed herein, as described in greater detail below with reference to FIGS. 3A and 3B. In various embodiments, and with reference to FIGS. 2 and 3A, the method 290 includes introducing a gaseous precursor into an inlet portion 312 of a chamber 310 at step 292 and introducing a gaseous mitigation agent into an outlet portion 313 of the chamber 310 at step 294, according to various embodiments. The inlet portion 312 of the chamber 310 houses one or more porous preforms 315, made from carbon or silicon carbide (SiC) fibers. The porous preforms 315 may be loaded into the inlet portion 312 of the chamber 310, which may be a reactor furnace or other reaction compartment. Generally, the introduction of the gaseous precursor at step 292 results in densification of the porous preforms 315 and the introduction of the gaseous mitigation agent at step 294 shifts the reaction equilibrium to disfavor the formation of harmful and/or pyrophoric deposits, which can accumulate in the exhaust conduit 340 that is coupled in fluidic communication to the outlet portion of the chamber 310, as described in greater detail below.

The gaseous precursor may be introduced via a first inlet 320 into the inlet portion 312 of the chamber 310 and the gaseous mitigation agent may be introduced via a second inlet 330 into the outlet portion 313 of the chamber 310. In various embodiments, these two steps 292, 294 are performed simultaneously to fabricate ceramic matrix composite components. In other words, both the gaseous precursor and the gaseous mitigation agent may be flowing into the respective portions 312, 313 of the chamber 310 during fabrication. Accordingly, in various embodiments, the inlet portion 312 of the chamber 310 is upstream of the outlet portion 313 of the chamber 310.

In various embodiments, the gaseous precursor is introduced via the first inlet 320 at an inlet upstream side 311 of the inlet portion 312 of the chamber 310 and the gaseous mitigation agent is introduced via the second inlet 330 into an outlet upstream side 314 of the outlet portion 313 of the chamber 310. In various embodiments, because the gaseous mitigation agent is introduced into the outlet portion 313 of the chamber 310, the gaseous mitigation agent may not directly interact with the fibrous/porous preforms 315 and thus may not directly affect the reaction chemistry, as described below, in the inlet portion 312 of the chamber 310. Instead, the gaseous mitigation agent generally conditions the effluent gas flowing from the inlet portion 312 to inhibit and/or mitigate the formation of harmful byproduct deposits in the exhaust piping (e.g., exhaust conduit 340), according to various embodiments.

In various embodiments, the respective flow rates of gaseous precursor and gaseous mitigation agent are different. Introducing the gaseous precursor at step 292 is performed at a first flow rate (e.g., a first molar flow rate, which refers to the number of moles per unit time that passes through an area) and introducing the gaseous mitigation agent at step 294 is performed at a second flow rate (e.g., a second molar flow rate). In various embodiments, the second molar flow rate is between about 50% and about 300% higher than the gaseous precursor flow rate in the first stream. In various embodiments, the second molar flow rate is between about 100% and about 200% higher than the gaseous precursor flow rate in the first stream. In various embodiments, the method 290 includes controlling the temperature and pressure within pressurizing the chamber 310 to specific values. For example, the method 290 may include heating the chamber 310 to above 1,000 degrees Celsius (1830 degrees Fahrenheit) and may include maintaining the chamber 310 at 10 torr (1.33 kilopascal).

The gaseous precursor includes, according to various embodiments, one or more reactants/reagents that react within the inlet portion 312 of the chamber 310 and infiltrate the pores of the porous preforms 315 to densify the porous preforms 315. For example, the gaseous precursor may include methyltrichlorosilane (MTS), dimethyldichlorosilane or trimethylchlorosilane, among others. The MTS may decompose in response to being introduced via the first inlet 320 into the inlet portion 312 of the chamber 310 and, via various intermediate reactions, may result in SiC deposits forming inside the pores of the porous preforms 315. Additional details pertaining to illustrative reactions that occur during the infiltration and deposition process are included below. The gaseous precursor stream may also include hydrogen gas, according to various embodiments. In various embodiments, the MTS constitutes about 5% of the gaseous precursor stream. In various embodiments, the gaseous mitigation agent is hydrogen gas.

In various embodiments, the reaction pathway that occurs within the chamber 310, with MTS and hydrogen gas constituting the gaseous precursor and with hydrogen gas constituting the gaseous mitigation agent, includes the following reactions:

$$CH_3SiCl_3 \rightarrow \cdot SiCl_3 + \cdot CH_3 \quad \text{Equation (1)}$$

$$\cdot SiCl_3 + \cdot CH_3 \rightarrow SiC + 3HCl \quad \text{Equation (2)}$$

$$\cdot CH_3 + H_2 \rightarrow CH_4 + \cdot H \quad \text{Equation (3)}$$

$$\cdot SiCl_3 + CH_3SiCl_3 \rightarrow HSiCl_3 + Cl_3SiCH_2 \cdot \quad \text{Equation (4)}$$

$$CH_3SiCl_3 \rightarrow Cl_2Si=CH_2 + HCl \quad \text{Equation (5)}$$

$$HSiCl_3 \rightarrow :SiCl_2 + HCl \quad \text{Equation (6)}$$

$$CH_3SiCl_3 \rightarrow ClCH_3 + :SiCl_2 \quad \text{Equation (7)}$$

$$:SiCl_2 + CH_4 \rightarrow :ClSiCH_3 + HCl \quad \text{Equation (8)}$$

$$ClCH_3 + H_2 \rightarrow CH_4 + HCl \quad \text{Equation (9)}$$

As mentioned above, the gaseous mitigation agent introduced at step 294 of the method 290 interacts with the effluent from the inlet portion 312 of the chamber 310 (i.e., interacts with the gaseous stream exiting the inlet portion 312 after passing over and through the porous preforms 315). In various embodiments, the gaseous mitigation agent shifts the reaction equilibrium of the above listed equations to disfavor the formation of harmful and/or pyrophoric deposits in the exhaust conduit 340. That is, the gaseous mitigation agent alters the stoichiometric ratios of the various/intermediate reactions to mitigate the formation of harmful byproducts which can accumulate within the exhaust conduit 340 of the system 305.

In various embodiments, the harmful byproduct deposits that conventionally form in the exhaust conduit are, for example, polychlorosilanes and cyclic carbosilanes that result from the free radicals and double bonded intermediate species produced in the equations above. Said differently, by using hydrogen gas as the gaseous mitigation agent, the "extra" hydrogen gas introduced at step 294 into the outlet portion 313 of the chamber 310 may drive production of HCl via Equation (9), and which may shift the reaction equilibrium to disfavor the formation of the free radical and double bond intermediate species formed in Equations (5), (6), and (8).

While numerous details are included herein pertaining specifically to using MTS as the gaseous precursor and hydrogen gas as the gaseous mitigation agent, other compounds may be utilized. For example, in various embodiments, the gaseous precursor may be dimethyldichlorosilane or trimethylchlorosilane, among others. In various embodiments, the gaseous mitigation agent may include water vapor, $NH_3$ gas, $BCl_3$ gas, or air, among others.

Figure 3A:
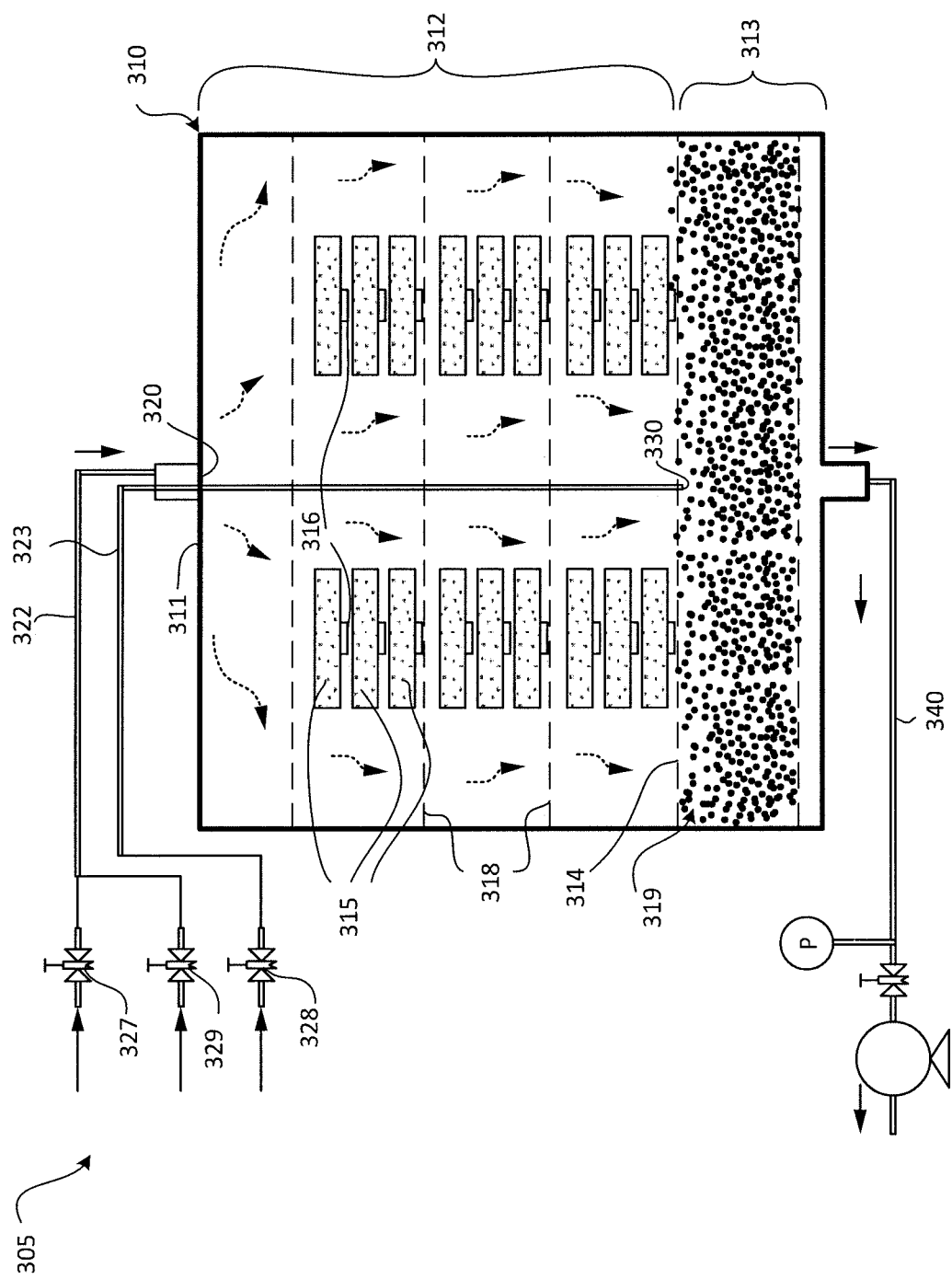
FIG. 3A is a schematic view of a ceramic matrix composite manufacturing system, in accordance with various embodiments.

In various embodiments, and with reference to FIG. 3A, the system 305, which may be a chemical vapor deposition/infiltration apparatus, may include a first supply conduit 322 and a second supply conduit 323. The first supply conduit 322 may deliver the gaseous precursor from a source to the inlet portion 312 of the chamber 310 via the first inlet 320. The second supply conduit 323 may deliver the gaseous mitigation agent from a source to the outlet portion 313 of the chamber 310 via the second inlet 330. A first valve 327 may be coupled to the first supply conduit 322 to control flow of the gaseous precursor and a second valve 328 may be coupled to the second supply conduit 323 to control flow of the gaseous mitigation agent. In various embodiments, the system 305 may also include a purge valve 329 that is configured to control flow of a purge gas, through one or both of the first and second supply conduits 322, 323, into the chamber 310 for purging the chamber after a completed CVD process.

In various embodiments, the second supply conduit 323 may extend into and through the inlet portion 312 of the chamber 310 to deliver the gaseous mitigation agent to the outlet portion 313 of the chamber 310. That is, the second inlet 330 may be an outlet end of the second supply conduit 323. In various embodiments, the second supply conduit 323 extends through the first inlet 320. For example, the second supply conduit 323 may extend into the chamber 310 so as to deliver the gaseous mitigation agent to a central, upstream section of the outlet portion 313 of the chamber 310. In various embodiments, the second inlet 330 is defined and disposed in a side wall of the chamber 310.

In various embodiments, the inlet portion 312 of the chamber 310 of the manufacturing system 305 may include one or more retention spacers 316 for retaining one or of the porous preforms 315. In various embodiments, the retention spacers 316 may facilitate distributing the porous preforms 315 throughout the inlet portion 312 of the chamber 310. The retention spacers 316 may be porous themselves, thus further allowing sufficient infiltration and deposition. In various embodiments, the chamber 310 may include one or more gas distributors 318 that facilitate the mixing and distribution of the gaseous precursor flowing through the housed porous preforms 315. The gas distributors 318 may also function to divide the inlet portion 312 into sub-compartments.

In various embodiments, the outlet portion 313 of the chamber 310 may define a gas mixing space 319 that may house a gas mixing substrate (e.g., a reaction sub-chamber). The gas mixing space 319 may facilitate mixing of the effluent gas from the inlet portion 312 with the gaseous mitigation agent introduced into the outlet portion 313 via the second inlet 330. The gas mixing space 319 may include a porous substrate. In various embodiments, the gas mixing space 319 may be loaded with a gas mixing substrate, such as volcanic rock or graphite, among other materials.

Figure 3B:
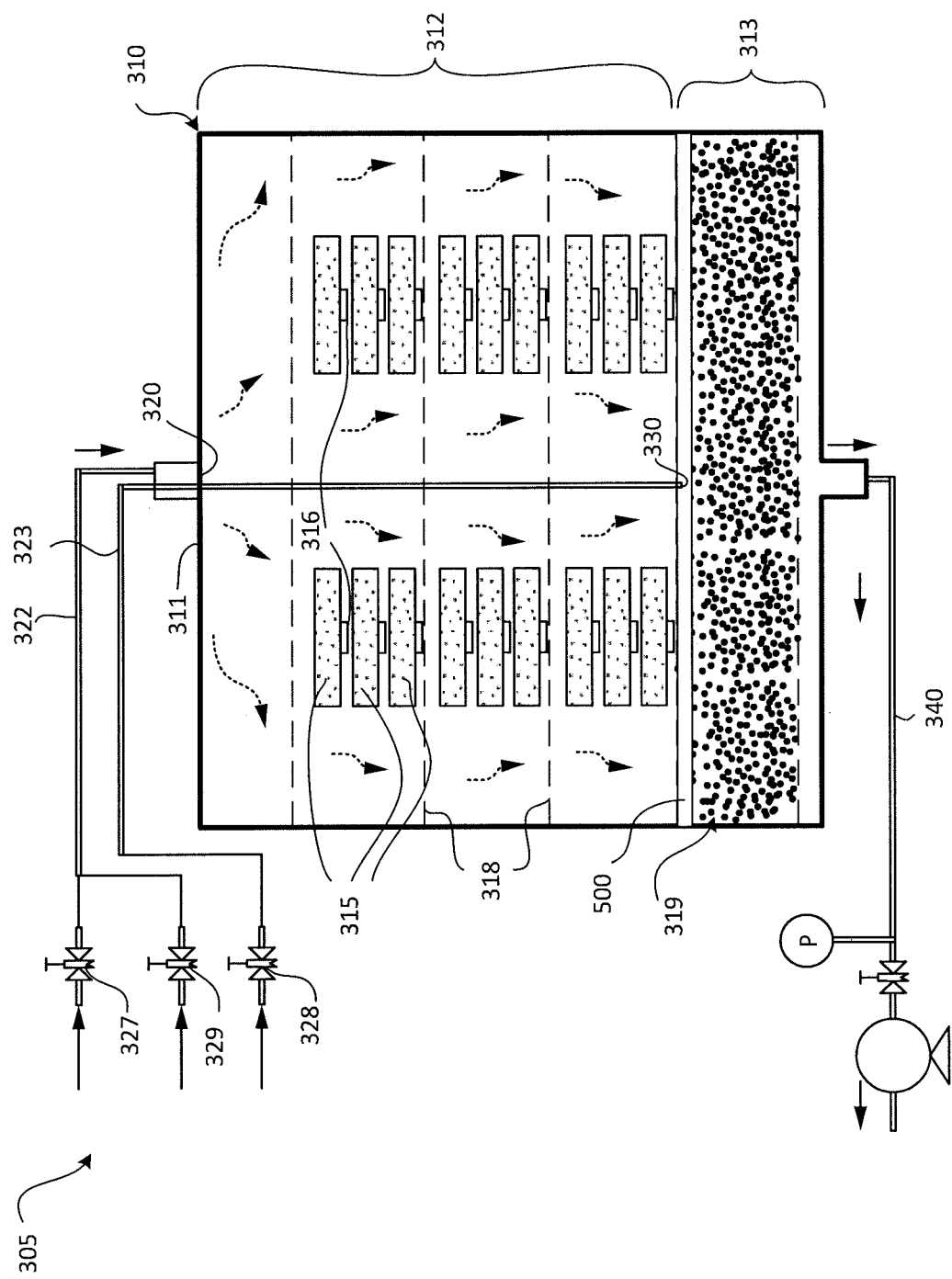
FIG. 3B is a schematic view of a ceramic matrix composite manufacturing system having a gas distribution plate, in accordance with various embodiments.

In various embodiments, and with reference to FIG. 3B, a gas distribution plate 500 (schematically depicted in FIG. 3B) may be utilized to facilitate intermixing of the gaseous mitigation agent with the reaction gas that is produced via the densification of the porous preforms (e.g., the reaction gas is the resultant gas from a chemical vapor deposition/infiltration system). As mentioned above, the mitigation agent generally shifts the reaction equilibrium to disfavor the formation of harmful and/or pyrophoric deposits, which can accumulate in the exhaust conduit 340 that is coupled in fluidic communication to the outlet portion of the chamber 310. Accordingly, by improving the extent of intermixing between the gaseous mitigation agent and the reaction gas, the formation of harmful and/or pyrophoric deposits can be further disfavored. In various embodiments, the gas distribution plate 500 is disposed between the inlet portion 312 and the outlet portion 313 of the chamber 310.

Figure 4:
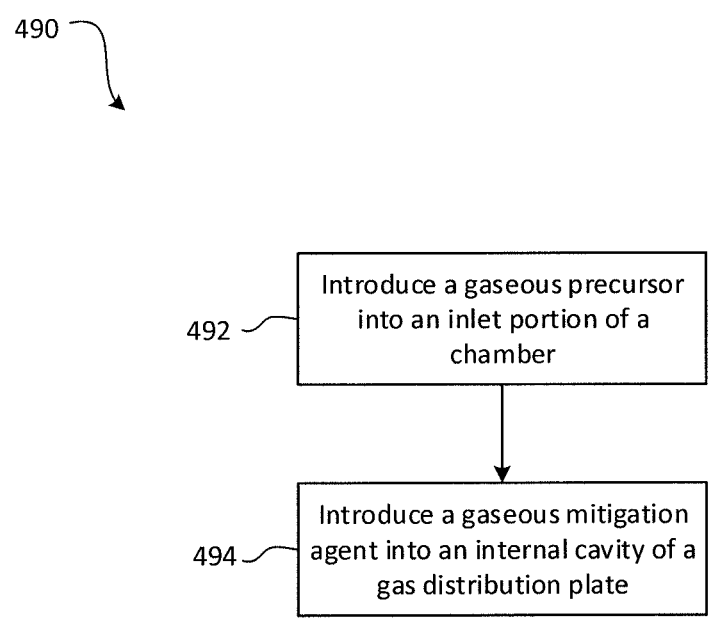
FIG. 4 is a schematic flow chart diagram of a method of manufacturing a ceramic matrix composite, in accordance with various embodiments.

Generally, and with reference to FIG. 4, a chemical vapor deposition/infiltration method 490, such as a method of manufacturing a ceramic matrix composite component, includes introducing a gaseous precursor into the inlet portion 312 of the chamber 310 at step 492 and introducing a gaseous mitigation agent into an internal cavity 514 (FIGS. 5A and 5B) of the gas distribution plate 500 at step 494. In various embodiments, the gaseous mitigation agent is configured to mix with the reaction gas downstream of the gas distribution plate 500, as described in greater detail immediately below.

Figure 5A:
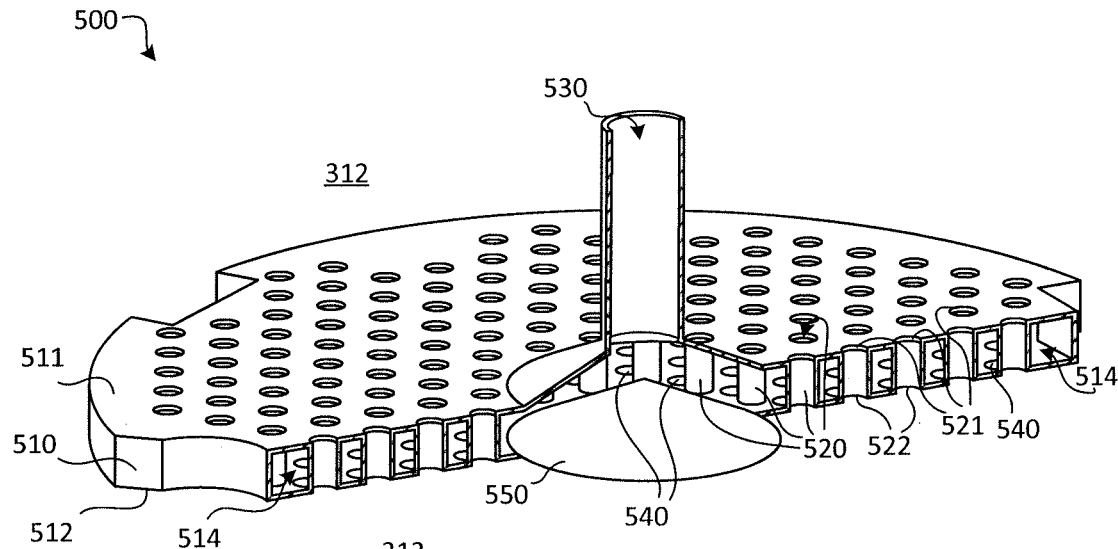
FIG. 5A is a perspective cross-sectional view of a gas distribution plate, in accordance with various embodiments.
Figure 5B:
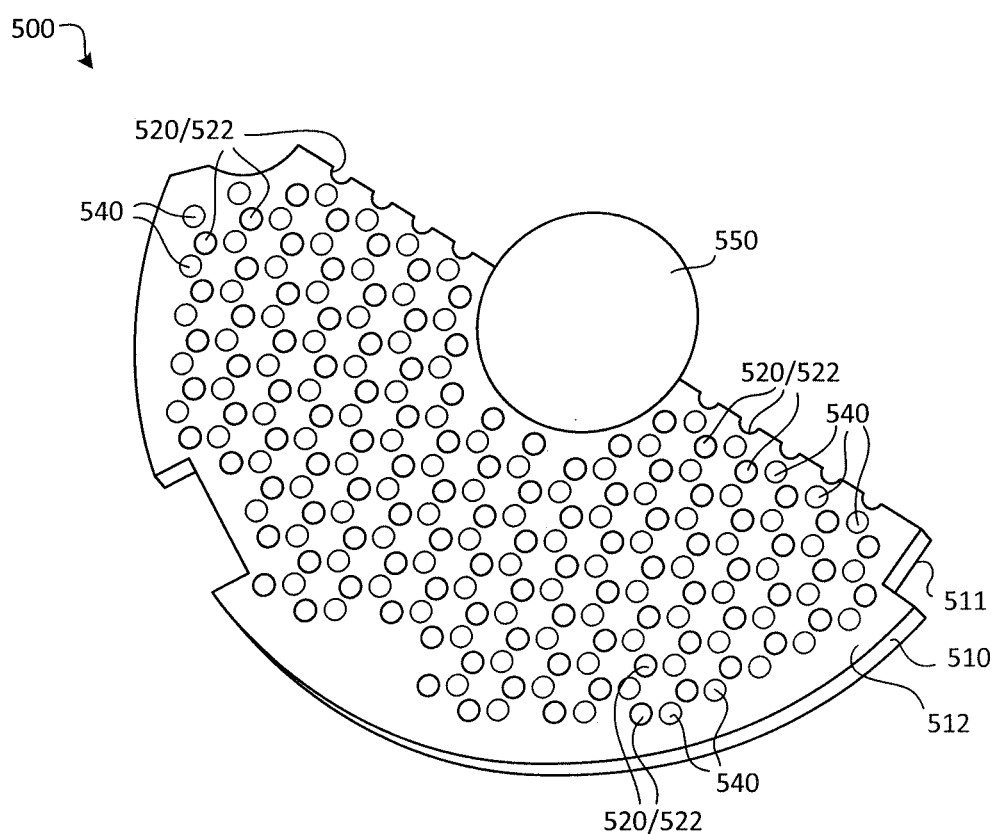
FIG. 5B is another perspective view of the gas distribution plate of FIG. 5A, in accordance with various embodiments.

In various embodiments, and with reference to FIGS. 5A and 5B, the gas distribution plate 500 includes a body 510 having a first side 511 and a second side 512 opposite the first side 511. The body 510 may have and define an internal cavity 514. In various embodiments, a plurality of pass-through tubes 520 extend through the internal cavity 514. Said differently, each pass-through tube 520 of the plurality of pass-through tubes extends from a first opening 521 defined in the first side 511 of the body 510 to a second opening 522 defined in the second side 512 of the body 510. The reaction gas that results from the chemical vapor deposition/infiltration process in the inlet portion 312 of the chamber 310 (i.e., the reaction product(s) of the gaseous precursor) is configured to flow through the plurality of pass-through tubes 520, in accordance with various embodiments. The gaseous mitigation agent, according to various embodiments, is configured to flow into the internal cavity 514 via a cavity inlet 530, which may be coupled in fluid receiving communication with second inlet 330 (FIGS. 3A and 3B). The gas distribution plate 500 may further include a plurality of cavity outlets 540 defined in the second side 512 of the body 510 through which the gaseous mitigation agent flows out of the internal cavity 514. Accordingly, the intermixing of the gaseous mitigation agent with the reaction gas is facilitated by distributing the second openings 522 of the plurality of pass-through tubes 520 among the cavity outlets 540.

In various embodiments, the reaction gas configured to flow through the plurality of pass-through tubes 520 is isolated from the gaseous mitigation agent in the internal cavity 514. That is, the reaction gas and the gaseous mitigation agent may not mix within the internal cavity 514, but instead may be configured to mix downstream of the second side 512 of the body 510 of the gas distribution plate 500. In various embodiments, and with continued reference to FIGS. 5A and 5B, the body 510 of the gas distribution plate 500 further includes a conical distribution feature 550 that protrudes into the internal cavity 514 from the second side 512 of the body 510 opposite the cavity inlet 530. The conical distribution feature 550 may facilitate radially outward flow of the gaseous mitigation agent, thereby promoting distribution of the gaseous mitigation agent through the plurality of cavity outlets 540. In various embodiments, the body 510 of the gas distribution plate 500 does not have any cavity outlets 540 or pass-through tubes 520 positioned in the footprint of the conical distribution feature 550. That is, the region of the body 510 that falls within the footprint of the conical distribution feature 550 may be solid and may be free of pass-through tubes, openings, apertures, etc. In various embodiments, the plurality of cavity outlets 540 and the second openings 522 of the plurality of pass-through tubes 520 are disposed outward of the footprint of the conical distribution feature 550 and may be distributed circumferentially around the conical distribution feature 550.

Figure 6:
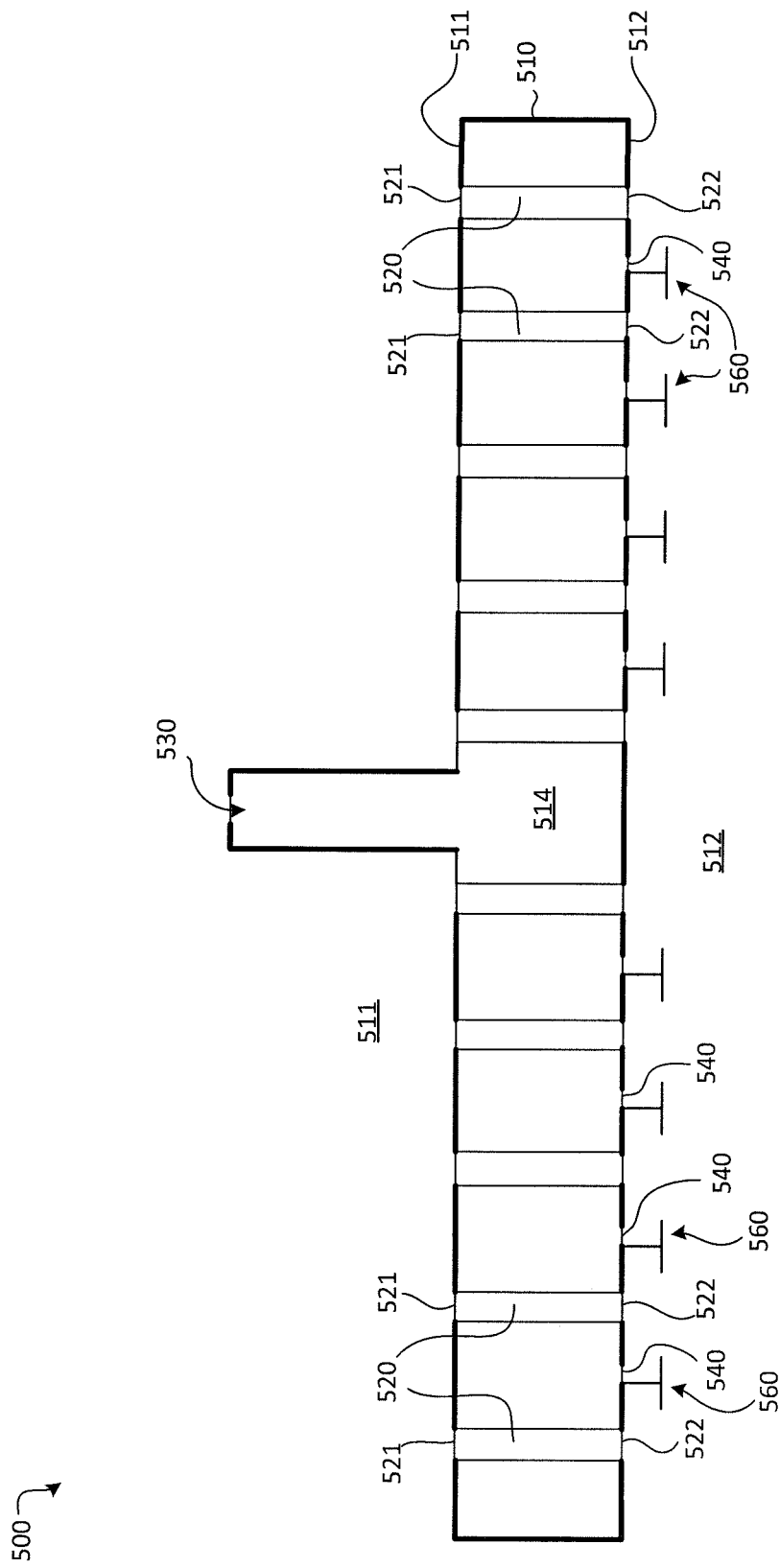
FIG. 6 is a cross-sectional view of a gas distribution plate, in accordance with various embodiments.

In various embodiments, and with reference to FIG. 6, the gas distribution plate 500 may further include a plurality of static mixing features 560 extending from the second side 512 of the body 510 of the gas distribution plate 500. The static mixing features 560, defined herein as non-moving, fixed elements, may be shaped and configured to augment mixing of the gaseous mitigation agent with the reaction gas. Said differently, the plurality of static mixing features facilitates intermixing of the gaseous mitigation agent with the reaction gas. In various embodiments, the static mixing features 560 may be "T" shaped. The static mixing features 560 may extend from the second side 512 of the body 510 of the gas distribution plate 500 adjacent the cavity outlets 540.

Figure 7A:
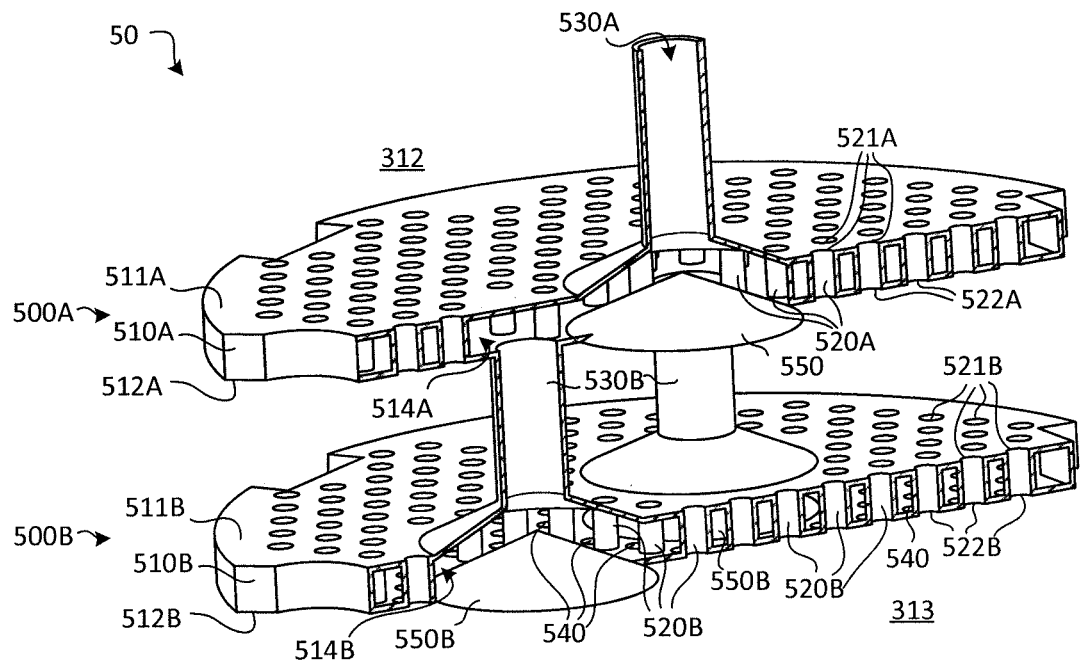
FIG. 7A is a perspective cross-sectional view of a system having two gas distribution plates, in accordance with various embodiments.
Figure 7B:
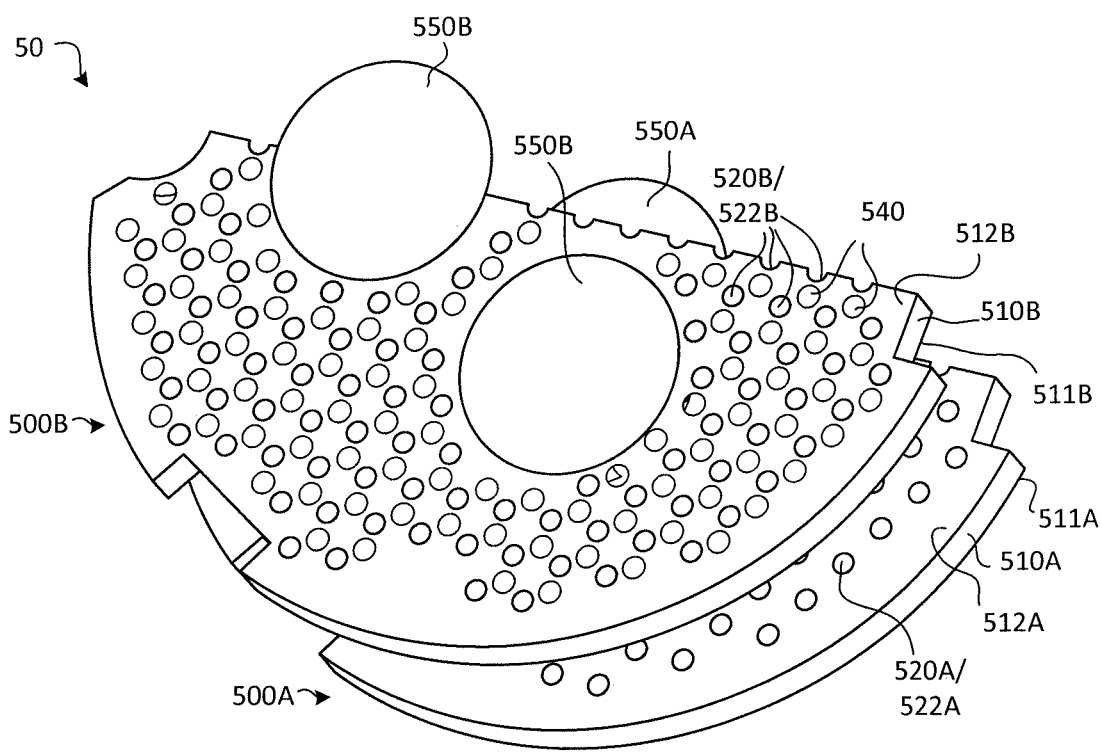
FIG. 7B is another perspective view of the system of FIG. 7A, in accordance with various embodiments.

In various embodiments, and with reference to FIGS. 7A and 7B, a dual plate system 50 is provided. The dual plate system 50 includes, according to various embodiments, a first gas distribution plate 500A and a second gas distribution plate 500B. The dual plate system 50 may be incorporated and utilized with a system of manufacturing a ceramic matrix composite, such as the system of FIGS. 3A and 3B. The first gas distribution plate 500A may be upstream of the second gas distribution plate 500B. For example, the second gas distribution plate 500B may be disposed between the first gas distribution plate 500A and the outlet portion 313 of the chamber 310.

The first gas distribution plate 500A may have a first body 510A having a first side 511A and a second side 512A. The first body 510A of the first gas distribution plate 500A may define a first internal cavity 514A, and a first plurality of pass-through tubes 520A may extend through the first internal cavity 514A from first openings 521A defined in the first side 511A of the first body 510A to second openings 522A defined in the second side 512A of the first body 510A. Similarly, the second gas distribution plate 500B may have a second body 510B having a first side 511B and a second side 512B. The second body 510B of the second gas distribution plate 500B may define a second internal cavity 514B, and a second plurality of pass-through tubes 520B may extend through the second internal cavity 514B from first openings 521B defined in the first side 511B of the second body 510B to second openings 522B defined in the second side 512B of the second body 510B.

The gaseous mitigation agent may be configured to flow into the internal cavity 514A via cavity inlet 530A (which may be coupled to or a component of second inlet 330). The gaseous mitigation agent may be configured to be distributed throughout the internal cavity 514A of the body 510A of the first gas distribution plate 500A. Instead of the gaseous mitigation agent flowing directly out of the internal cavity 514A to be mixed directly with the reaction gas flowing through the plurality of pass-through tubes 520, the gaseous mitigation agent may instead flow from the internal cavity 514A via a plurality of second cavity inlets 530B that extend between and fluidly couple the first internal cavity 514A of the first body 510A of the first gas distribution plate 500A to a second internal cavity 514B defined in the second body 510B of the second gas distribution plate 500B. The first cavity inlet 530A may be a central conduit and the plurality of cavity inlets 530B may be offshoot conduits that are positioned around the central conduit. In various embodiments, the first body 510A of the first gas distribution plate 500A may not have cavity outlets, such as cavity outlets 540 described above with reference to FIGS. 3A and 3B, defined in the second side 512A of the first body 510A of the first gas distribution plate 500A. Thus, the gaseous mitigation agent may flow sequentially through both the first internal cavity 514A and the second internal cavity 514B before mixing with the reaction gas. Such a configuration provides allows the reaction gas to flow through two stages of pass-through tubes 520A, 520B before mixing with the gaseous mitigation agent. The second gas distribution plate 500B may further include a plurality of static mixing features 560 (e.g., described above with reference to FIG. 6).

Figure 8:
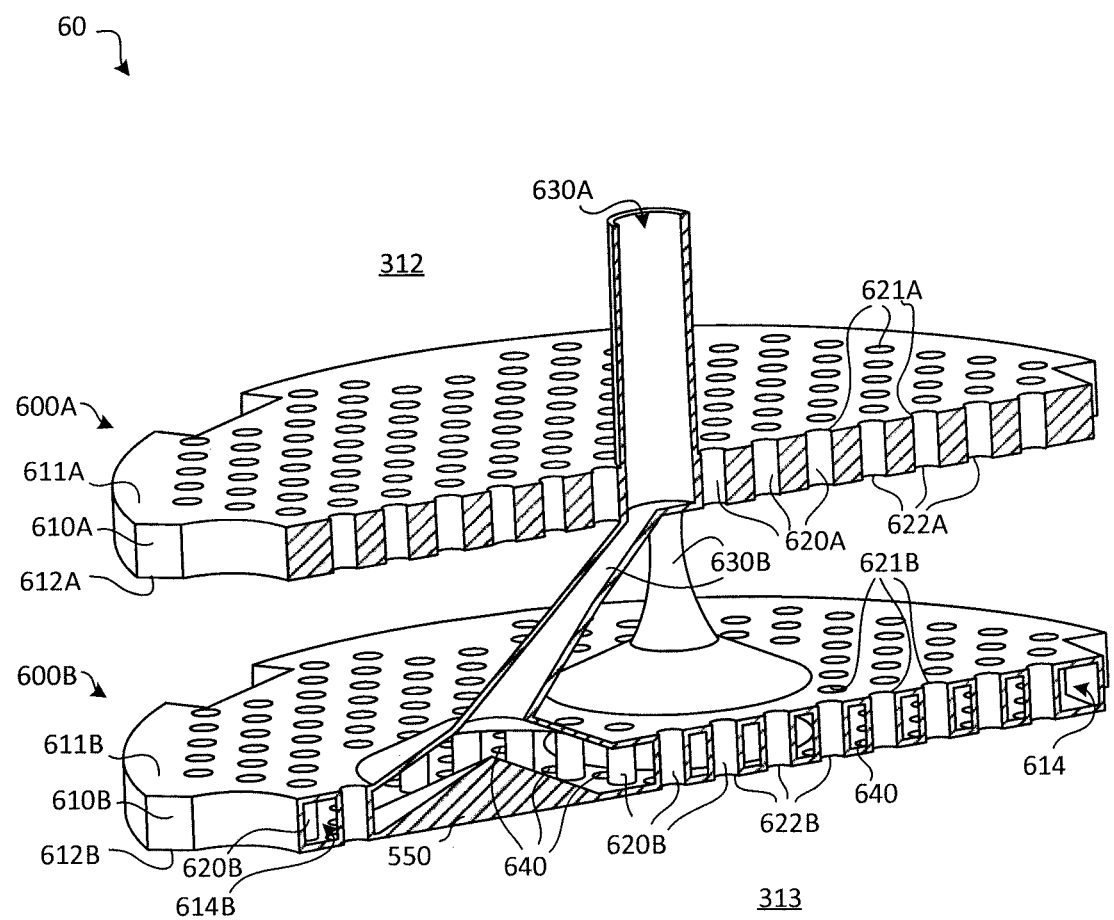
FIG. 8 is a perspective cross-sectional view of a system having two gas distribution plates, in accordance with various embodiments.

In various embodiments, and with reference to FIG. 8, another dual plate system 60 is provided. The dual plate system 60 includes, according to various embodiments, a first gas distribution plate 600A and a second gas distribution plate 600B. The dual plate system 60 may be similar to dual plate system 50 described above, and may accordingly be incorporated and utilized with a system of manufacturing a ceramic matrix composite, such as the system of FIGS. 3A and 3B. The first gas distribution plate 600A may have a first body 610A having a first side 611A and a second side 612A. The first body 610A of the first gas distribution plate 600A may not define an internal cavity (i.e., may not be hollow) and instead may be solid, except for a first plurality of pass-through tubes 620A may extend through the first body 610A from the first side 611A of the first body 610A to the second side 612A of the first body 610A. The second gas distribution plate 600B may have a second body 610B having a first side 611B and a second side 612B. The second body 610B of the second gas distribution plate 600B may define an internal cavity 614B, and a second plurality of pass-through tubes 620B may extend through the internal cavity 614B from first openings 621B defined in the first side 611B of the second body 610B to second openings 622B defined in the second side 612B of the second body 610B. In such a configuration, the gaseous mitigation agent may flow through the first gas distribution plate 600A via central pass-through conduit 630A and flows to the internal cavity 614B of the second gas distribution plate 600B via one or more offshoot conduits 630B that are positioned around the central conduit 630A. The gaseous mitigation agent is then distributed throughout the internal cavity 614B of the second gas distribution plate 600B and then flows out of the internal cavity 614B via a plurality of cavity outlets 640 to mix with the reaction gas that passed through the two stages of pass-through tubes 620A, 620B. The second gas distribution plate 600B may further include a plurality of static mixing features 560 (e.g., described above with reference to FIG. 6).

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system comprising:
    a chamber comprising an inlet portion and an outlet portion, wherein the inlet portion is configured to house a porous preform;
    a first inlet for introducing a gaseous precursor into the inlet portion of the chamber;
    a first gas distribution plate disposed between the inlet portion and the outlet portion of the chamber, the first gas distribution plate defining a first internal cavity;
    a second gas distribution plate disposed between the first gas distribution plate and the outlet portion of the chamber, the second gas distribution plate defining a second internal cavity;
    a second inlet for introducing a gaseous mitigation agent into the first internal cavity defined in the first gas distribution plate, wherein the first gas distribution plate and the second gas distribution plate are configured such that the gaseous mitigation agent is configured to sequentially flow through both the first internal cavity and the second internal cavity before mixing with a reaction gas from the inlet portion of the chamber; and
    an exhaust conduit coupled in fluidic communication with the outlet portion of the chamber.

2. The system of claim 1, wherein the first gas distribution plate is configured to distribute the gaseous mitigation agent through the first internal cavity before the gaseous mitigation agent flows into the second internal cavity of the second gas distribution plate, wherein the second gas distribution plate comprises a plurality of pass-through tubes, wherein the second gas distribution plate facilitates mixing the gaseous mitigation agent with the reaction gas from the plurality of pass-through tubes.

3. The system of claim 1, wherein the second inlet is configured to introduce the gaseous mitigation agent into the first internal cavity via a first cavity inlet, wherein the gaseous mitigation agent is configured to flow from the first internal cavity to the second internal cavity via a plurality of second cavity inlets extending between the first gas distribution plate and the second gas distribution plate.

4. The system of claim 3, wherein the first cavity inlet is a central conduit and the plurality of second cavity inlets are offshoot conduits that are positioned around the central conduit.

\* \* \* \* \*